(12) United States Patent
Yajima (10) Patent No.: US 12,343,754 B2
(45) Date of Patent: Jul. 1, 2025

(54) LIQUID SUPPLYING DEVICE

(71) Applicant: Koganei Corporation, Koganei (JP)

(72) Inventor: Takeo Yajima, Koganei (JP)

(73) Assignee: Koganei Corporation, Koganei (JP)

( * ) Notice: Subject to any disclaimer, the term of this patent is extended or adjusted under 35 U.S.C. 154(b) by 469 days.

(21) Appl. No.: 17/659,390

(22) Filed: Apr. 15, 2022

(65) Prior Publication Data

US 2022/0331833 A1 Oct. 20, 2022

(30) Foreign Application Priority Data

Apr. 15, 2021 (JP) .................... 2021-068884

(51) Int. Cl.
| | |
|---|---|
| *B05C 11/10* | (2006.01) |
| *F04B 45/02* | (2006.01) |
| *F04B 45/06* | (2006.01) |
| *G03F 7/16* | (2006.01) |

(52) U.S. Cl.
CPC .......... *B05C 11/1002* (2013.01); *F04B 45/02* (2013.01); *F04B 45/06* (2013.01); *G03F 7/162* (2013.01)

(58) Field of Classification Search
USPC ................ 118/683, 684, 602, 52, 612
See application file for complete search history.

(56) References Cited

U.S. PATENT DOCUMENTS

| | | | | |
|---|---|---|---|---|
| 6,056,998 A | * | 5/2000 | Fujimoto | ............ H01L 21/6715 118/683 |
| 6,238,576 B1 | | 5/2001 | Yajima | |
| 2004/0144736 A1 | | 7/2004 | Yajima | |
| 2006/0093493 A1 | * | 5/2006 | Maruyama | .............. B05C 11/10 417/410.5 |
| 2006/0174828 A1 | * | 8/2006 | Mekias | ............. H01L 21/67017 118/66 |
| 2007/0031273 A1 | | 2/2007 | Yajima | |
| 2015/0090340 A1 | | 4/2015 | Takayanagi et al. | |

FOREIGN PATENT DOCUMENTS

| | | |
|---|---|---|
| CN | 104511408 A | 4/2015 |
| CN | 109254500 A | 1/2019 |
| JP | H10054368 A | 2/1998 |
| JP | 2000120530 A | 4/2000 |

(Continued)

OTHER PUBLICATIONS

English Translation JP-2015088702A (Year: 2015).*

(Continued)

*Primary Examiner* — Yewebdar T Tadesse
(74) *Attorney, Agent, or Firm* — Gregory L. Mayback; Mayback IP Law, P.A.

(57) ABSTRACT

A liquid supplying device includes: a first pump and a second pump respectively provided in a liquid supplying path that supplies liquid contained in a liquid accommodating portion to an applicator; a filter passing through the liquid that flows toward the applicator; and a return flow path that returns the liquid passing through the filter to the liquid accommodating portion. In a circulating mode that supplies the liquid to the return flow path and stops supply of the liquid to the applicator, any of the first pump and the second pump continuously supplies the liquid to the return flow path.

8 Claims, 8 Drawing Sheets

(56) References Cited

FOREIGN PATENT DOCUMENTS

| | | | | | |
|---|---|---|---|---|---|
| JP | 2005083337 | A | | 3/2005 | |
| JP | 2006061872 | A | | 3/2006 | |
| JP | 2015072985 | A | | 4/2015 | |
| JP | 2015088702 | A | * | 5/2015 | ............... G03F 7/16 |
| JP | 2017220547 | A | * | 12/2017 | ........... B05B 9/0406 |
| KR | 20030048515 | A | | 6/2003 | |
| KR | 20070078699 | A | * | 8/2007 | |
| TW | 405170 | B | * | 9/2000 | |
| TW | 200301509 | A | * | 7/2003 | ......... B01D 19/0068 |

OTHER PUBLICATIONS

English Translation JP-2017220547A (Year: 2017).*
English Translation TW200301509A (Year: 2003).*
English Translation TW405170B (Year: 2000).*
English Translation KR-20070078699-A (Year: 2007).*
Notice of Preliminary Rejection in related application No. KR10-2022-0034461 mailed by the Korean Intellectual Property Office on Sep. 26, 2023.
Notification of First Office action in related application No. CN202210264148.0 mailed by the China National Intellectual Property Administration on May 30, 2024 (Chinese).
Notification of First Office action in related application No. CN202210264148.0 mailed by the China National Intellectual Property Administration on May 30, 2024 (English).
Notification of the first Office action in related Japan application No. 2021-068884 mailed by the Japan Patent Office on Jul. 16, 2024 (Japanese).
Notification of the first Office action in related Japan application No. 2021-068884 mailed by the Japan Patent Office on Jul. 16, 2024 (English).
Abstract of the Disclosure from Japan Patent Publication No. JP2006061872A (English).
Taiwan Patent Application No. 111104629 Office Action dated Dec. 23, 2022, including English Translation, 13 pages.

* cited by examiner

LIQUID SUPPLYING DEVICE

CROSS-REFERENCE TO RELATED APPLICATION

This application claims the priority, under 35 U.S.C. §§ 119, 120, 172, 363, and 365, of Japanese Patent Application No. 2021-068884, filed on Apr. 15, 2021; the prior application is herewith incorporated by reference in its entirety.

STATEMENT REGARDING FEDERALLY SPONSORED RESEARCH OR DEVELOPMENT

Not Applicable

FIELD OF THE INVENTION

The present invention relates to a liquid supplying device that applies liquid such as chemical liquid to an object(s) to be coated.

BACKGROUND OF THE INVENTION

In a manufacturing process of semiconductor devices and liquid crystal substrates, chemical liquid such as photoresist liquid has been used. For example, in the manufacturing process of a semiconductor device, in order to apply photoresist liquid to a surface of a semiconductor wafer, the photoresist liquid is dropped on the surface of the semiconductor wafer while the semiconductor wafer is rotated in a horizontal plane. A pump used in a chemical liquid supplying device used for applying the photoresist liquid includes a tubephragm pump equipped with a tubephragm that is a flexible tube radially expandable and contractable, a bellows pump equipped with a flexible bellows axially expandable and contractable, and the like. These pumps are displacement pumps having a suction process and a discharge process.

As described in Patent Document 1 (Japanese patent application laid-open No. 2005-83337), the tubephragm pump has a tubephragm, that is, a flexible tube arranged between a joint member on an inflow side and a joint member on an outflow side. An inside of the tube forms a pump chamber that expands and contracts, and an outside of the tube forms a drive chamber filled with an incompressible liquid medium. There are a container accommodating type in which the tube is accommodated (housed) inside a container and a drive chamber is formed between the container and the tube, and a bellows accommodating type in which the tube is accommodated inside a bellows coupling two large and small bellows different in diameter and a drive chamber is formed between the bellows and the tube.

In the container accommodating type, the pump chamber expands and contracts through the liquid medium in the drive chamber due to supply and discharge of the liquid medium from the outside of the container, thereby performing a pump operation. Meanwhile, in the bellows accommodating type, the pump chamber expands and contracts through the liquid medium in the drive chamber formed inside the two large and small bellows by reciprocating a coupling portion thereof axially, thereby performs a pump operation.

As described in Patent Document 2 (Japanese Patent Application Laid-open No. H10-54368), a bellows pump has a pump block as a pump case and a bellows arranged inside the pump block, and a pump chamber is formed between the bellows and the pump case. The bellows includes a bellows portion axially expandable and contractable, a tip portion provided at a tip of the bellows portion, and an annular base end portion provided at a base end of the bellows portion. A drive shaft arranged inside the bellows is coupled to the tip portion of the bellows portion, and the bellows portion expands and contracts axially by the drive shaft, thereby causing the pump chamber to expand and contract to perform the pump operation. Patent Document 2 discloses a bellows pump in which two bellows cause two pump chambers to alternately expand and contract to continuously discharge liquid.

Patent Document 3 (Japanese Patent Application Laid-open No. 2000-120530) discloses a chemical liquid supplying device equipped with a bellows accommodating type tubephragm pump. This chemical liquid supplying device has a liquid supplying path which supplies chemical liquid such as resist liquid or polyimide liquid contained in a bottle, i.e., liquid to a nozzle, i.e., applicator, and a pump and a filter are provided in the liquid supplying path, the nozzle applying the liquid to the coated object such as a wafer. The liquid discharged from the pump is supplied to the applicator, and the device has a return flow path for returning the liquid to an upstream portion of the liquid supplying path and the bolt.

SUMMARY OF THE INVENTION

In the liquid supplying device provided with the return flow path in the liquid supplying path, when the liquid is not applied from the applicator, the liquid can be returned to the upstream portion through the return flow path. Consequently, the liquid is filtered by passing through a filter more than once, so that foreign substances of fine particles i.e., particles, contained in the liquid, and bubbles, etc. are removed by the filter, which can reduce the foreign substances contained in the liquid applied to the coated object.

In recent years, in a field of semiconductor manufacturing technology and the like, in order to improve a manufacturing yield, it is desired to further increase a reduction rate and a reduction amount of foreign substances contained in the liquid. It is conceivable to increase the reduction amount of foreign substances contained in the coated object if the number of circulations of the liquid passing through the filter is increased by increasing a flow rate of the liquid returned to a bottle side through the return flow path.

In order to increase the number of circulations of the liquid, it is necessary to increase the flow rate of the liquid within a limited time. However, the pump in which a tubephragm, bellows, or the like made of a flexible resin material is used as a pump member has a structure optimized for an application flow rate or an applying operation onto the coated object, and there is a limit to increasing the flow rate of this type of pump.

The present invention increases an amount of liquid circulating in the liquid supplying path provided with the filter, and increases the reduction amount of foreign substances contained in the liquid.

A liquid supplying device of the present invention is a liquid supplying device that supplies liquid contained in a liquid accommodating portion to an applicator, the applicator applying the liquid to a coated object, the liquid supplying device including: a first pump and a second pump respectively provided in a liquid supplying path that supplies the liquid contained in the liquid accommodating portion to the applicator; a filter provided in the liquid supplying path to filter the liquid that flows toward the applicator; a return flow path for returning the liquid, which has passed through the filter, to the liquid accommodating portion; and a control unit that controls the first pump and the second pump in a coating mode and a circulating mode, the liquid being supplied to the applicator and supply of the liquid to the return flow path being stopped in the coating mode, the liquid being supplied to the return flow path and the supply of the liquid to the applicator being stopped in the circulating mode, in which, in the coating mode, one of the first pump and the second pump discharges an application amount of liquid to the coated object and, in the circulating mode, the other of the first pump and the second pump continuously flows a return flow rate of liquid to the return flow path.

In the circulating mode, the liquid continuously circulates in the return flow path, and the liquid returned toward the liquid accommodating portion is supplied to the liquid supplying path by the return flow path, so that the liquid passes through the filter more than once and foreign substances contained in the liquid can be reduced. Since the liquid suppling device has the first and second pumps, the liquid can be constantly circulated in the circulating mode and the discharge amount can be controlled with high accuracy in the coating mode.

DETAILED DESCRIPTION OF THE EMBODIMENTS

Figure 1:
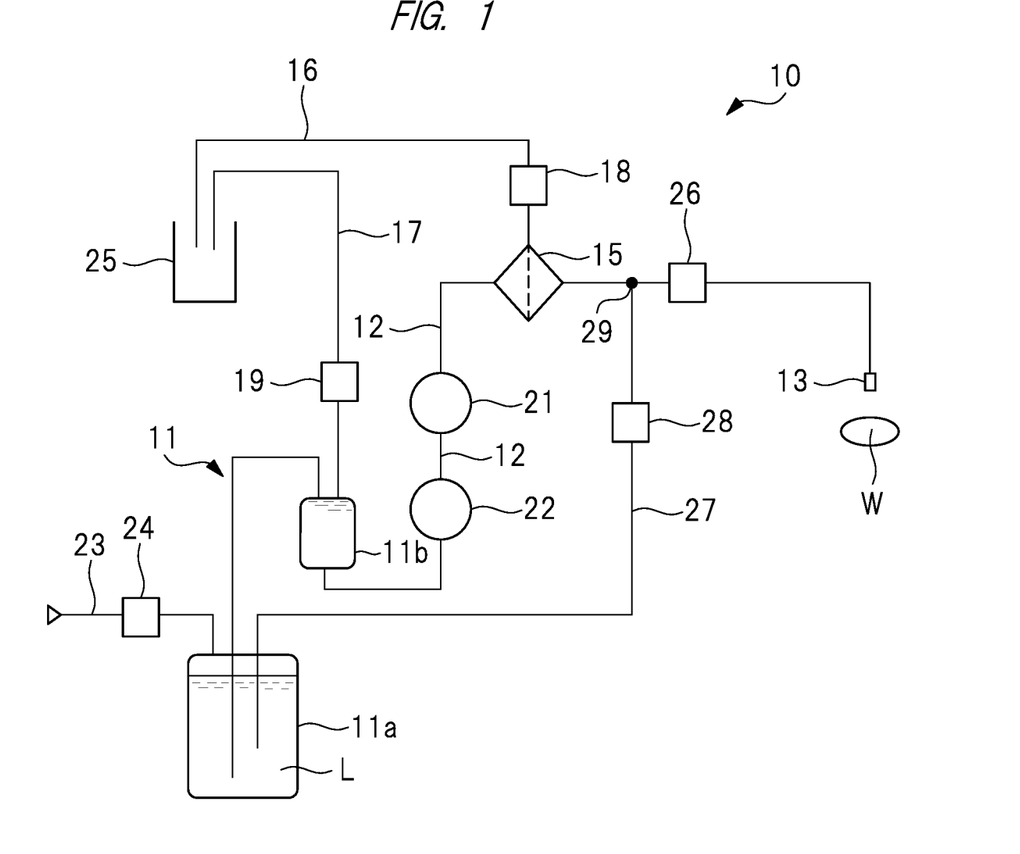
FIG. 1 is a schematic view showing a liquid supplying device according to an embodiment.

Hereinafter, embodiments of the present invention will be described in detail with reference to the drawings. A liquid supplying device 10 shown in FIG. 1 is used to apply liquid L such as photoresist liquid contained in a liquid accommodating portion 11 to a coated object W such as a semiconductor wafer. The liquid supplying device 10 has a liquid supplying path 12 composed of a pipe, a hose, or the like, an applicator (coating tool) 13 such as a nozzle is provided at a tip of the liquid supplying path 12, and a liquid accommodating portion 11 is provided at a base end portion of the liquid supplying path 12.

Two pumps 21, 22 are provided so as to be connected to the liquid supplying path 12 in series, and the pump 21 installed on a downstream side of the liquid supplying path 12 is a first pump, and the pump 22 installed on an upstream side is a second pump. The liquid in the liquid accommodating portion 11 is supplied to the applicator 13 by both pumps 21 and 22. The liquid accommodating portion 11 includes a tank 11a and a buffer tank 11b, and when a remaining amount of liquid in the tank 11a becomes empty below a predetermined value or less, it is replaced with a new tank. In order to supply the liquid to the applicator 13 even at the time of replacement, the buffer tank 11b is located on the upstream side of the pump 22 and is provided in the liquid supplying path 12. The buffer tank 11b is used for an allowance of time to replace the empty tank 11a with a new tank 11a that is filled with liquid, and the replacement work of the tank 11a is performed by the time the liquid in the buffer tank 11b is emptied.

A filter 15 for filtering the liquid discharged from the pump 21 is provided on a downstream side of the pump 21. A vent flow path 16 is connected to the filter 15 in order to discharge gas in the filter 15 outside. Further, a vent flow path 17 is connected to the buffer tank 11b in order to discharge gas in the buffer tank 11b outside. Opening/closing valves 18, 19 are provided in the vent flow paths 16, 17, respectively.

In order to discharge the gas in the buffer tank 11b outside, a pressurized flow path 23 is connected to the tank 11a, and the pressurized flow path 23 supplies nitrogen gas, which is an inert gas, from outside. When the opening/closing valve 24 provided in the pressurized flow path 23 supplies the inert gas from the pressurized flow path 23 into the tank 11a with the vent flow path 17 opened by the opening/closing valve 19, gas in the buffer tank 11b is discharged outside by the vent flow path 17. When the inert gas is supplied into the tank 11a with the vent flow path 16 opened by the opening/closing valve 18, the gas in the filter 15 is discharged outside. However, the gas in the filter 15 can also be discharged by discharging the liquid from the pump 21 with the vent flow path 16 opened by the opening/closing valve 18. Discharging ends of the vent flow paths 16, 17 are arranged in a recovery container 25 in order to recover the liquid and the like that have been discharged together with the gas when the gas is discharged from the vent flow paths 16, 17, respectively.

A coating valve 26 is provided in the liquid supplying path 12 in order to apply the liquid filtered by the filter 15 from the applicator 13 to the coated object W. A return flow path 27 for returning the liquid, which has passed through the filter 15, to the liquid accommodating portion 11 is connected to the liquid supplying path 12. An upstream end of the return flow path 27 is connected to the liquid supplying path 12 at a connecting portion 29 between the filter 15 and the coating valve 26, and a downstream end portion of the return flow path 27 is connected to the liquid accommodating portion 11. A circulating valve 28 is provided in the return flow path 27. The downstream end portion of the return flow path 27 can be connected between the tank 11a and the buffer tank 11b or between the buffer tank 11b and the pump 22.

Figure 2:
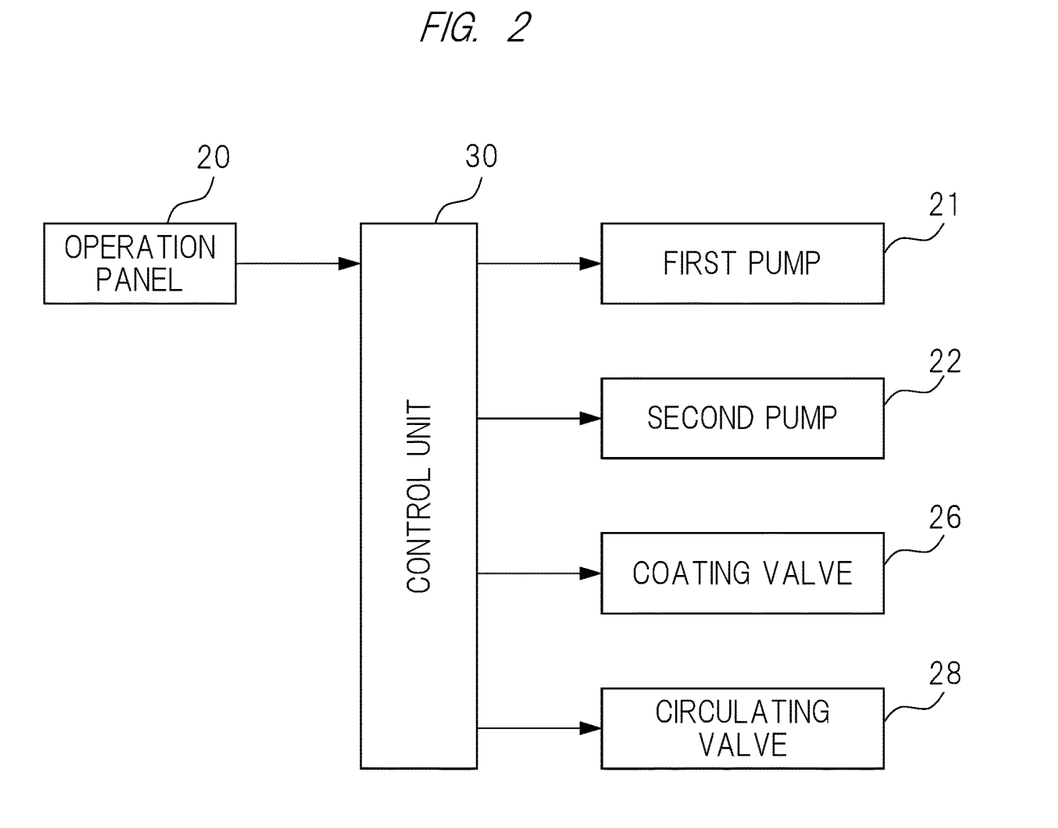
FIG. 2 is a block diagram showing a control circuit of the liquid supplying device.

FIG. 2 is a block diagram showing a control circuit of the liquid supplying device, and each operation of the first pump 21, the second pump 22, the coating valve 26, and the circulating valve 28 described above is controlled by a control unit 30. The control unit 30 is connected to an operation panel 20, and the operation of the liquid supplying device 10 is started by a command key (not shown) provided on the operation panel 20. The control unit 30 has a microprocessor for calculating a control signal, a memory for storing a control program, and the like.

The operations of the pumps 21, 22 and the valves 26, 28 are controlled by the control unit 30, and the liquid supplying device 10 is set to a coating mode and a circulating mode. The other members shown in FIG. 1 are also controlled by signals from the control unit 30. However, in FIG. 2, only the members that have been set in the coating mode and the circulating mode are shown.

Figure 3:
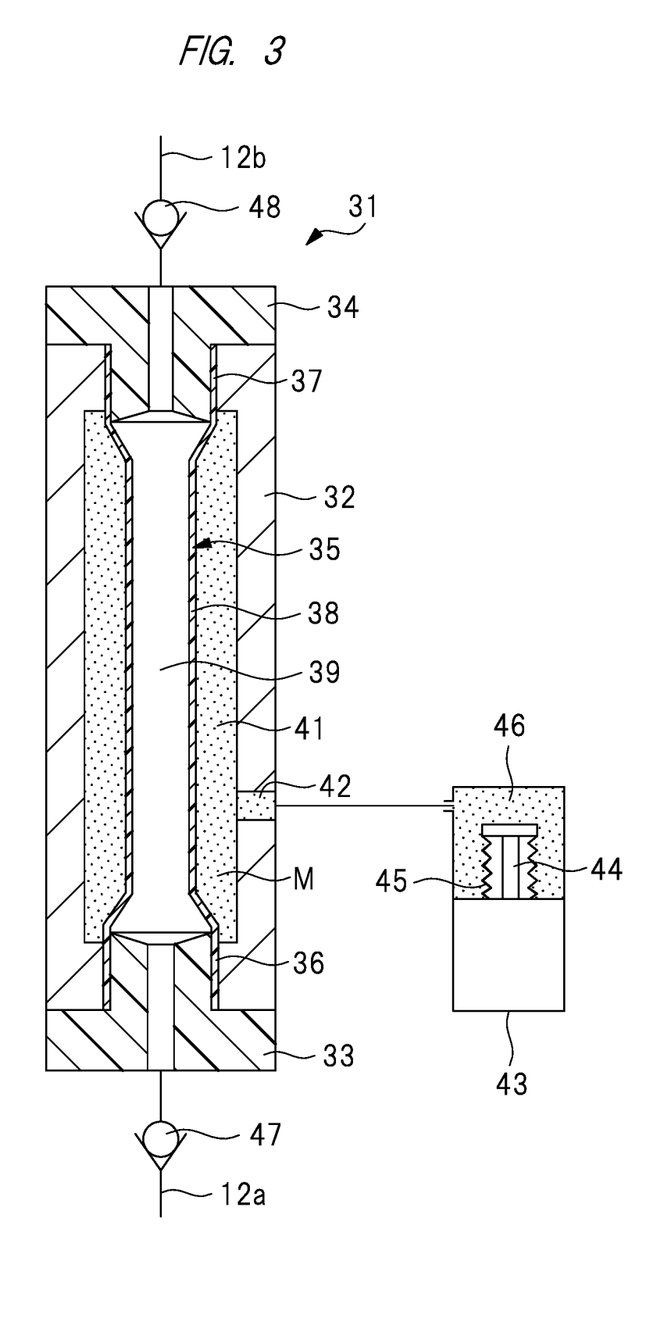
FIG. 3 is a sectional view showing an example of a tubephragm pump.

FIG. 3 is a sectional view showing a tubephragm pump 31, and this tubephragm pump 31 is a displacement type and can be applied as the pumps 21, 22 shown in FIG. 1.

As shown in FIG. 3, the tubephragm pump 31 has a cylindrical storage container 32 as a storage member, an inflow-side joint member 33 provided at one end portion thereof, and an outflow-side joint member 34 provided at the other end portion. An inflow-side portion 12a of the liquid supplying path 12 is connected to the inflow-side joint member 33, and an outflow-side portion 12b is connected to the outflow-side joint member 34. A flexible tube, that is, a tubephragm 35 is provided in the storage container 32, and the tubephragrm 35 has an inflow-side fixed end portion 36 fixed to the inflow-side joint member 33, and an outflow-side fixed end portion 37 fixed to the outflow-side joint member 34, and an elastically deformed portion 38 between both fixed end portions 36, 37. The joint members 33,34 and the tubephragm 35 are each formed of a synthetic resin such as a fluororesin.

An inner pump chamber 39 of the tubephragm 35 and an outer liquid accommodating chamber 41 thereof are partitioned by the tubephragm 35, and the liquid accommodating chamber 41 is formed between the tubephragm 35 and the storage container 32. In this way, the tubephragm 35 is provided in the storage container 32, and the tubephragm pump 31 is a container storage type.

The liquid accommodating chamber 41 is filled with non-compressible liquid as a liquid medium M, and the liquid medium M is supplied to the liquid storage chamber 41 from outside via a supply/discharge port 42 formed in the storage container 32. A supply/discharge pump 43 is connected to the supply/discharge port 42. The supply/discharge pump 43 has a bellows 45 attached to a rod 44 that reciprocates linearly, and the rod 44 is driven axially by a driving member such as an electric motor or a pneumatic cylinder. A liquid accommodating chamber 46 outside the bellows 45 is also filled with a liquid medium, and the liquid accommodating chamber 46 communicates with the liquid accommodating chamber 41 of the tubephragm pump 31 by the liquid medium M.

When the liquid medium M is supplied from the liquid accommodating chamber 46 toward the liquid accommodating chamber 41 by driving the supply/discharge pump 43, the elastically deformed portion 38 of the tubephragm 35 radially contracts by the liquid medium in the liquid accommodating chamber 41, thereby causing the pump chamber 39 to contract. Meanwhile, when the liquid medium is discharged from the liquid accommodating chamber 41, the elastically deformed portion 38 expands radially, thereby causing the pump chamber 39 to expand. A check valve 47 is provided in the inflow-side portion 12a of the liquid supplying path 12, a check valve 48 is provided in the outflow-side portion 12b. When the pump chamber 39 expands, liquid L flows into the pump chamber from the inflow-side portion 12a. At this time, a backflow of the liquid from the outflow-side portion 12b is prevented. Meanwhile, when the pump chamber 39 contracts, the liquid L flows out from the pump chamber 39 toward the outflow-side portion 12b. At this time, a backflow of the liquid to the inflow-side portion 12a is prevented. The check valve 47 may be incorporated into the joint member 33, and the check valve 48 may be incorporated into the joint member 34. Further, the liquid medium M may be supplied/discharged to/from the liquid accommodating chamber 41 by the rod 44 without providing the bellows 45 in the supply/discharge pump 43.

Figure 4:
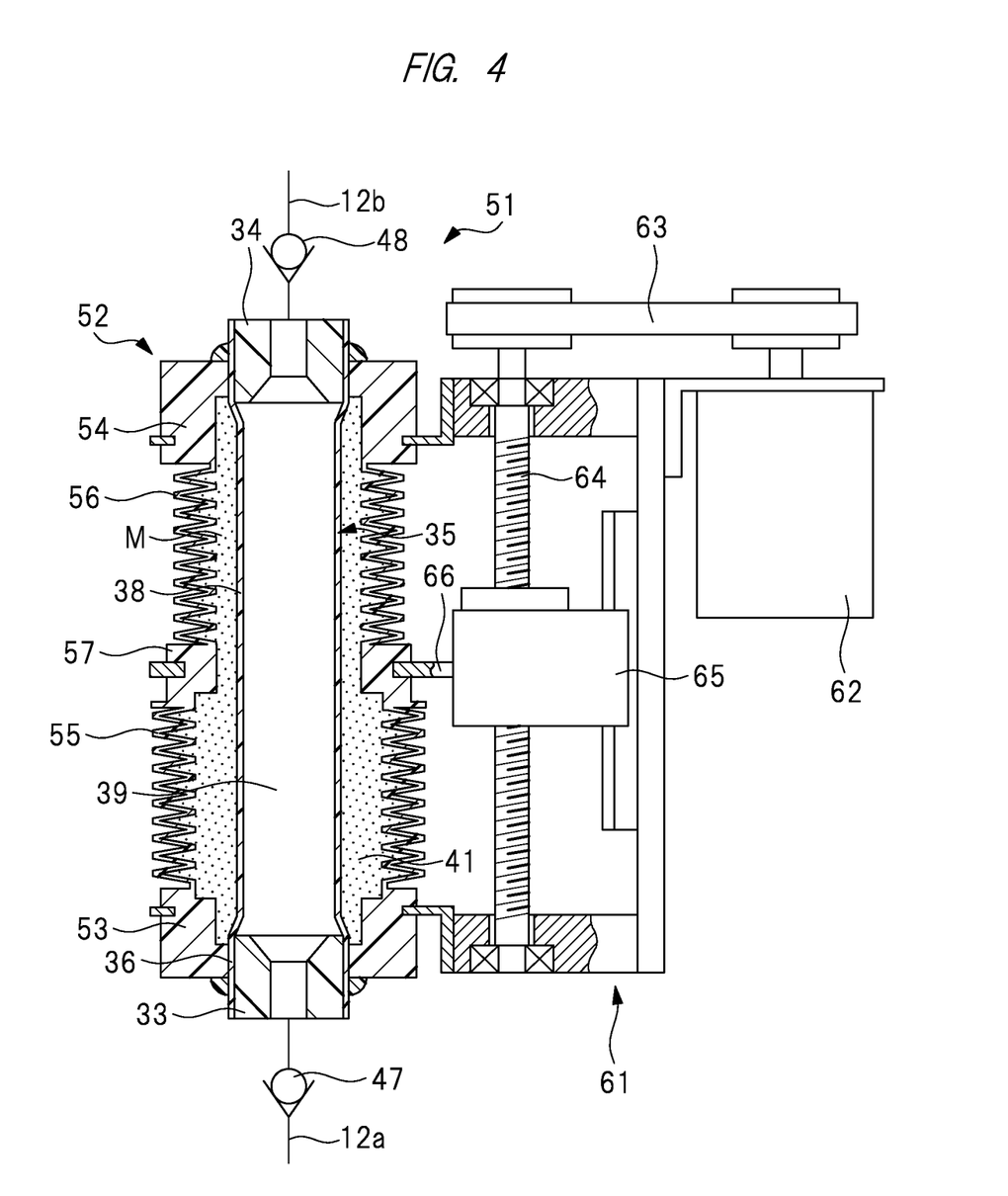
FIG. 4 is a sectional view showing a tubephragm pump which is a modification example.

FIG. 4 is a sectional view showing a tubephram pump 51 which is a modification example, and this tubephragm pump 51 can also be applied as the pumps 21, 22 shown in FIG. 1.

This tubephragm pump 51 is a bellows accommodating type in which the tubephragm 35 is accommodated inside a bellows container 52 as a storage member. The bellows container 52 has a fixing ring 53 attached to the inflow-side joint member 33, and a fixing ring 54 attached to the outflow-side joint member 34. The fixing ring 53 is provided with a large bellows 55, the fixing ring 54 is provided with a small bellows 56, and an actuating ring 57 is provided between both bellows 55, 56. An average effective diameter of the large bellows 55 is larger than an average effective diameter of the small bellows 56. The bellows container 52 is integrally molded with a rigid resin such as a fluororesin including both fixing rings 53, 54 and a portion between them.

The same tubephragm 35 as that shown in FIG. 3 is mounted inside the bellows container 52, and the liquid accommodating chamber 41 is formed between the tubephragm 35 and the bellows container 52. A pump drive unit 61 is attached to the bellows container 52 in order to axially deform both bellows 55, 56 to expand and contract the pump chamber 39 radially via the liquid medium M in the liquid accommodating chamber 41. The pump drive unit 61 has a ball screw 64 driven by an electric motor 62 via a power transmission mechanism 63, and a ball nut 65 screw-coupled to the ball screw 64. The ball nut 65 is provided with an actuating member 66 that is engaged with the actuating ring 57.

When the actuating ring 57 is driven upward in FIG. 4 by the electric motor 62, the large bellows 55 elongates axially and the small bellows 56 contracts axially, so that the average effective diameter of the entire bellows becomes large. Consequently, the tubephragm 35 expands radially, and the liquid L flows into the pump chamber 39 from the inflow-side portion 12a. Meanwhile, when the actuating ring 57 is driven in a reverse direction, the large bellows 55 contracts axially and the small bellows 56 elongates axially, so that the average effective diameter of the entire bellows becomes smaller. Consequently, the tubephragm 35 contracts radially and the liquid L in the pump chamber 39 flows out from the outflow-side portion 12b.

Therefore, when the ball nut 65 is linearly reciprocated by the electric motor 62, the elastically deformed portion 38 of the tubephragm 35 expands and contracts and the liquid L flows out from the pump chamber 39 toward the outflow-side portion 12b in the same manner as the tubephragm pump 31 shown in FIG. 3, so that a pump operation is performed.

The tubephragm pumps 31, 51 shown in FIGS. 3 and 4 each have one pump chamber 39, and are intermittent discharge pumps in which a discharging operation and a sucking operation from and in the pump chamber 39 are alternately performed. The intermittent discharge pump can control a discharge amount with high accuracy. In contrast, as a pump which unitizes at least two tubephragm pumps and has at least two pump chambers, there is a continuous discharge pump. This continuous discharge pump can continuously discharge the liquid, by being set so that while one pump chamber contracts to perform a discharging operation, the other pump chamber is expanded to perform a sucking operation. In FIG. 1, the first pump 21 is an intermittent discharge pump configured by one pump chamber, and the second pump 22 is a continuous discharge pump configured by two pump chambers. However, the first pump 21 may be used as a continuous discharge pump, and the second pump 22 may be used as an intermittent discharge pump.

Figure 5:
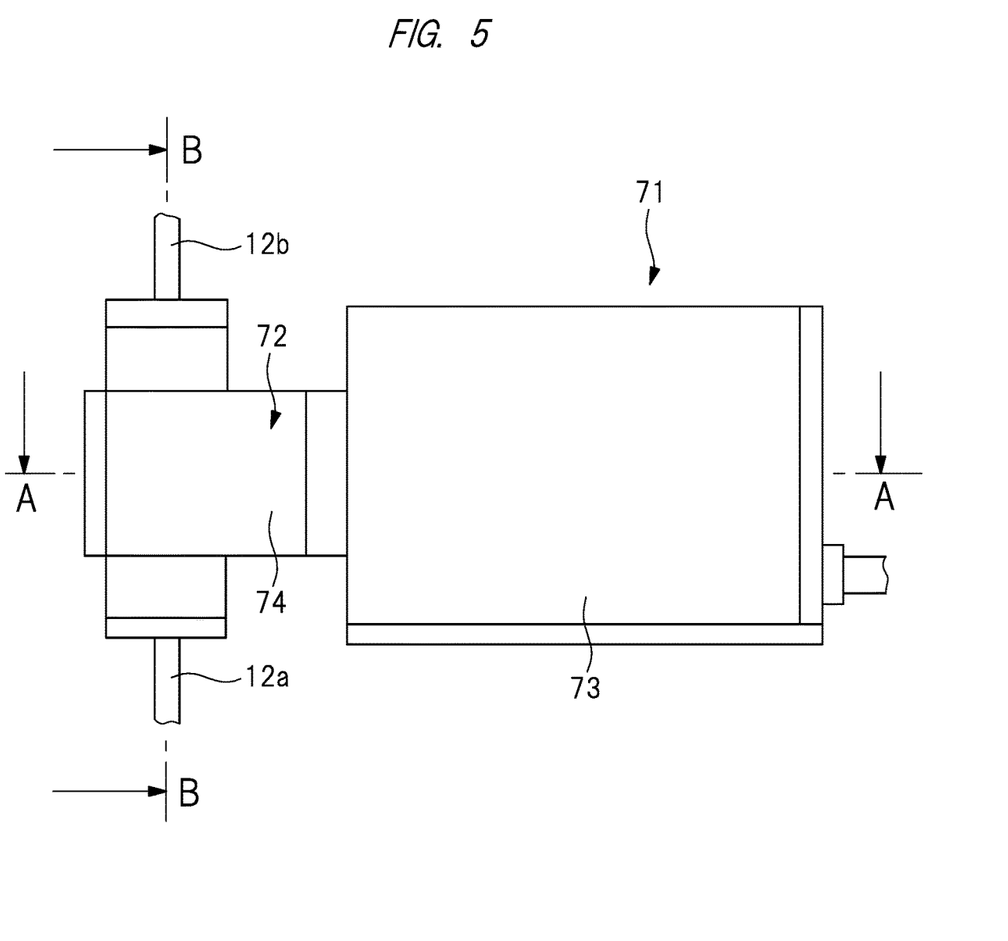
FIG. 5 is a front view showing an appearance of a bellows pump.
Figure 6:
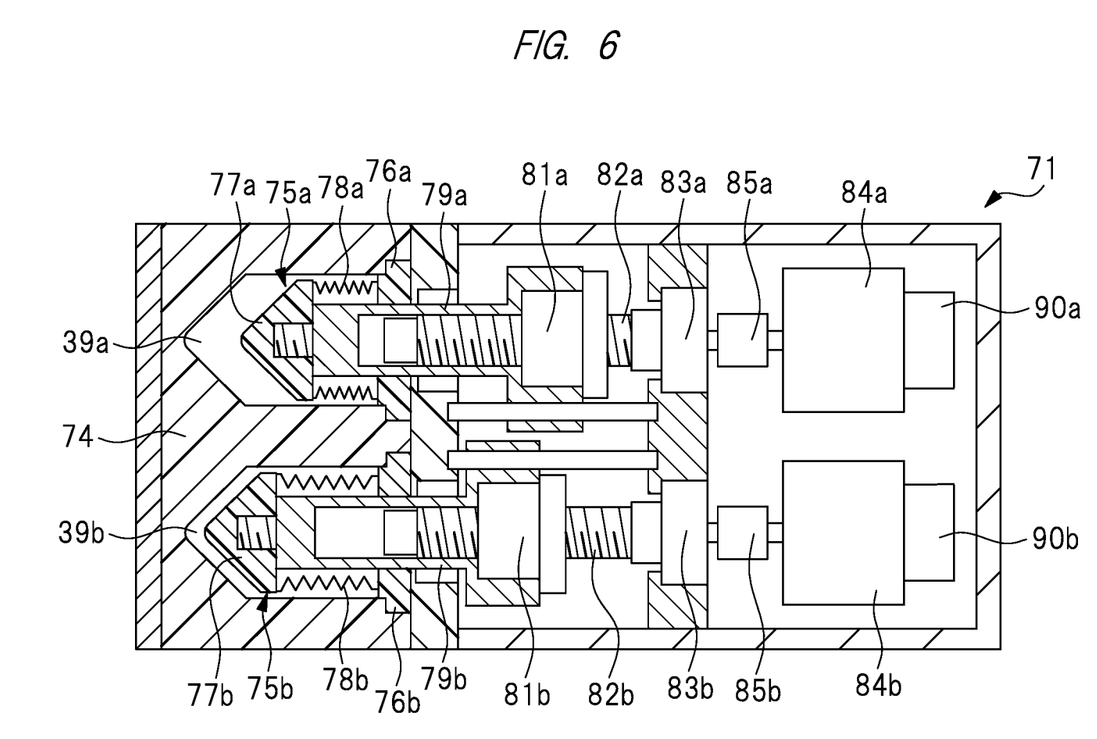
FIG. 6 is a sectional view taken along line A-A in FIG. 5.
Figure 7:
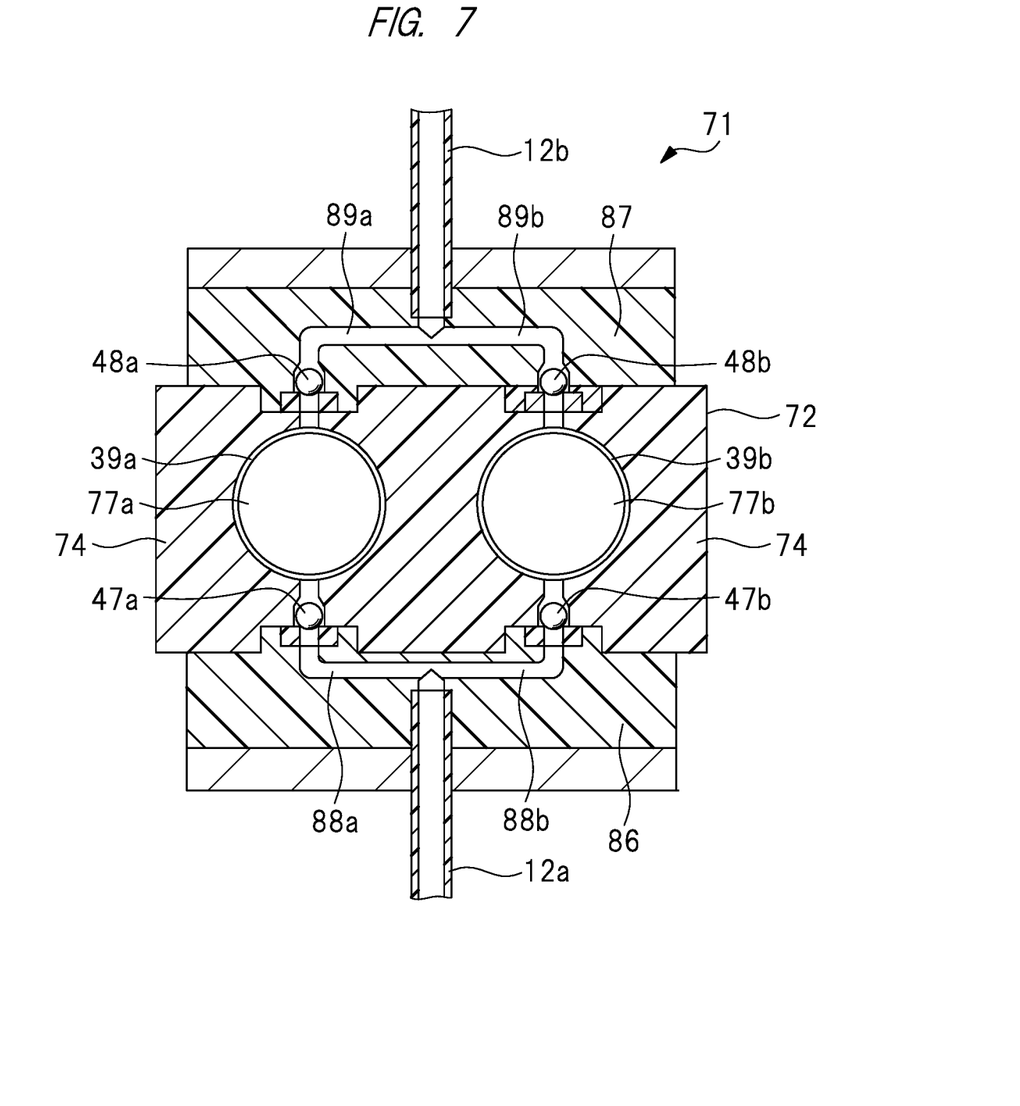
FIG. 7 is a sectional view taken along line B-B in FIG. 5.

FIGS. 5 to 7 show a bellows pump 71 as a modification example of the displacement pump. The bellows pump 71 has a pump housing 72 and a drive unit 73, and the pump housing 72 includes a pump block 74 made of a synthetic resin such as a fluororesin. The two pump chambers 39a, 39b are formed in the pump block 74, a bellows 75a is incorporated in the pump chamber 39a, and a bellows 75b is incorporated in the pump chamber 39b. The respective bellows 75a, 75b have annular base portions 76a, 76b fixed to the pump block 74, closed end portions 77a, 77b, stretchable bellows portions 78a, 78b between them, all of which are formed of a synthetic resin.

In order to axially extend and contract the bellows portions 78a, 78b for drive, drive shafts 79a, 79b are arranged inside the bellows 75a, 75b, and tips of the drive shafts 79a, 79b are attached to the closed end portions 77a, 77b. Nuts 81a, 81b are attached to a large-diameter base end portions of the drive shafts 79a, 79b, and the ball screws 82a, 82b are screw-coupled to the nuts 81a, 81b, respectively. The ball screws 82a, 82b are rotatably supported by bearings 83a, 83b provided on the drive unit 73. The ball screw 82a is coupled to a shaft of the electric motor 84a by a joint 85a, and the ball screw 82b is coupled to a shaft of the electric motor 84b by a joint 85b.

As shown in FIG. 7, the inflow-side block 86 is attached to a lower surface of the pump block 74, and the outflow-side block 87 is attached to an upper surface thereof. Inflow flow paths 88a, 88b communicating with the inflow-side portion 12a of the liquid supplying path 12 are formed in the inflow-side block 86, the inflow flow path 88a communicates with the pump chamber 39a, and the inflow flow path 88b communicates with the pump chamber 39b. Outflow flow paths 89a, 89b communicating with the outflow-side portion 12b are formed in the outflow-side block 87, the outflow flow path 89a communicates with the pump chamber 39a, and the outflow flow path 89b communicates with the pump chamber 39b. Check valves 47a, 47b are provided in the inflow flow paths 88a, 88b, respectively, and check valves 48a, 48b are provided in the outflow flow paths 89a, 89b, respectively.

When the bellows 75a, 75b are elongated by driving the electric motors 84a, 84b, the pump chambers 39a, 39b contract and the liquid L passes through the check valves 48a, 48b and is discharged from the outflow-side portion 12b. Meanwhile, when the bellows 75a, 75b are contracted, the pump chambers 39a, 39b expand and the liquid L passes through the check valves 47a, 47b and flows in from the inflow-side portion 12a. FIG. 6 shows a state in which the bellows 75b elongates and the bellows 75a contracts.

The bellows pump 71 is a continuous discharge pump capable of continuously discharging the liquid L to the outflow-side portion 12b since it includes two bellows 75a, 75b and since while one of the bellows 75a, 75b is elongated and the liquid is discharged from one of the pump chambers 39a, 39b, the other of the bellows 75a, 75b is contracted and the other of the pump chambers 39a, 39b sucks the liquid. Encoders 90a, 90b are provided on the electric motors 84a, 84b in order to detect rotation speeds and rotation directions of the electric motors 84a, 84b, respectively.

As shown in FIG. 1, the two pumps 21, 22 are provided in the liquid supplying path 12. When the coating valve 26 is operated for opening and the circulating valve 28 is operated for closing, one of the first pump 21 and the second pump 22 supplies the liquid to the applicator 13 and applies an application amount of liquid to the coated object W.

Meanwhile, when the coating valve 26 is operated for closing and the circulating valve 28 is operating for opening, the other of the first pump 21 and the second pump 22 supplies the return flow rate of liquid to the return flow path 27. Since all the liquid discharged from both of the pumps 21, 22 pass through the filter 15 and are supplied to the return flow path 27 and the applicator 13, cleanliness of the liquid can be increased by causing the liquid to pass through the filter 15 more than once.

Figure 8:
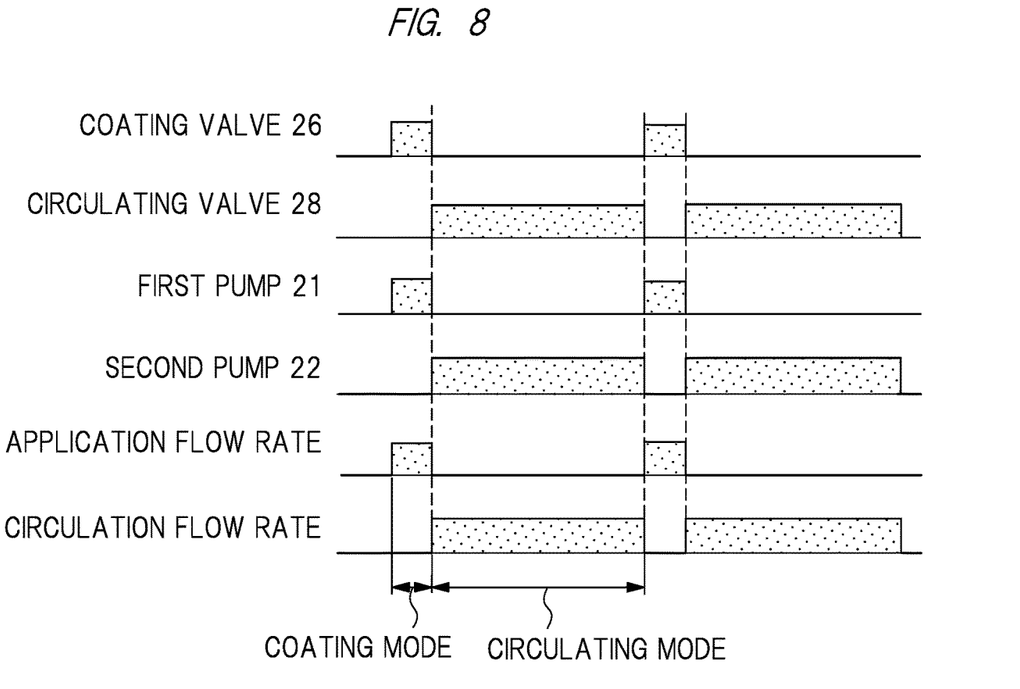
FIG. 8 is a time chart showing an example of pump drive for performing a liquid applying operation of liquid from an applicator.

FIG. 8 is a time chart showing a coating mode of performing an applying operation of the liquid L from the applicator 13 and a circulating mode of performing a circulating operation thereof when the first pump 21 provided downstream serves as an intermittent discharge pump and the second pump 22 provided upstream serves as a continuous discharge pump. An application flow rate in FIG. 8 indicates a flow rate of the liquid flowing through the applicator 13, and a circulation flow rate indicates a flow rate of the liquid flowing through the return flow path 27.

In the coating mode, the coating valve 26 opens and the circulating valve 28 closes, so that the liquid is discharged to the coated object W and the supply of the liquid to the return flow path 27 is stopped. Meanwhile, in the circulating mode, since the coating valve 26 is closed and the circulating valve 28 is opened, the discharge to the coated object W is stopped and the liquid to the return flow path 27 is supplied. Instead of the coating valve 26 and the circulating valve 28, the connecting portion 29 may be provided with a three-way valve as a switching means for switching between the coating mode and the circulating mode.

In the circulating mode, only the second pump 22, which is a continuous discharge pump, is driven, so that the liquid can always be circulated in the return flow path 27. Therefore, in the circulating mode, the amount of circulating liquid can be increased to increase the reduction amount of foreign substances contained in the liquid. Further, in the coating mode, only the first pump 21, which is an intermittent discharge pump, is driven, so that the discharge amount can be controlled with high accuracy. Incidentally, the sucking operation of the first pump may be performed during the circulating mode or the coating mode.

Using one out of the tubephragm pumps 31, 51 and the bellows pump 71 as the both pumps 21, 22 makes it possible to reduce possibility in which the foreign subjects such as wear debris can be contained in the liquid since there is no sliding portion unlike the piston type pump. Further, when the both pumps 21, 22 are arranged in series, the liquid always passes through the both pumps 21, 22, so that the generation of particles can be suppressed and the cleanliness of the liquid can be improved. In addition, when the first pump 21 is used as an intermittent discharge pump and the second pump 22 is used as a continuous discharge pump, the liquid discharge accuracy can be further improved.

The present invention is not limited to the above-described embodiments, and can be variously modified without departing from the scope thereof. For example, the embodiment may have a configuration in which: the first pump serves as a continuous discharge pump; the second pump serves as an intermittent discharge pump; the second pump 22 is driven in the coating mode to stop the first pump 21; and the first pump 21 is stopped in the circulating mode to drive the second pump 22.

What is claimed is:

1. A liquid supplying device that supplies liquid contained in a liquid accommodating portion to an applicator, the applicator applying the liquid to a coated object, the liquid supplying device comprising:

a first pump and a second pump respectively provided in a liquid supplying path that supplies the liquid contained in the liquid accommodating portion to the applicator;

a filter provided in the liquid supplying path to filter the liquid that flows toward the applicator;

a return flow path for returning the liquid, which has passed through the filter, to the liquid accommodating portion; and a control unit that controls the first pump and the second pump in a coating mode and a circulating mode, the liquid being supplied to the applicator and supply of the liquid to the return flow path being stopped in the coating mode, the liquid being supplied to the return flow path and the supply of the liquid to the applicator being stopped in the circulating mode, wherein, the first pump is an intermittent discharge pump that alternatively performs a discharge operation and a sucking operation;

the second pump is a continuous discharge pump that continuously discharges the liquid;

in the coating mode, the control unit controls the first pump to discharge an application amount of liquid to the coated object, and in the circulating mode, the control unit controls the second pump to continuously flow a return flow rate of liquid to the return flow path.

2. The liquid supplying device according to claim 1, wherein the first pump and the second pump are connected in series, the filter is arranged between a downstream pump and the applicator, and a connecting portion that connects the return flow path and the liquid supplying path is provided between the applicator and the filter.

3. The liquid supplying device according to claim 2, further comprising:

a coating valve provided between the connecting portion and the applicator; and a circulating valve provided in the return flow path, wherein, in the circulating mode, the coating valve is closed and the circulating valve is opened, and in the coating mode, the coating valve is opened and the circulating valve is closed.

4. The liquid supplying device according to claim 2, wherein the connecting portion is provided with a switching means that switches the coating mode and the circulating mode.

5. The liquid supplying device according to claim 2, wherein the second pump is located on an upstream side of the first pump, in the coating mode, a coating amount of liquid is applied to the coated object only by the first pump, and in the circulating mode, a return flow rate of liquid is returned to the return flow path only by the second pump.

6. The liquid supplying device according to claim 5, wherein the first pump comprises:

a tubephragm which expands and contracts radially and in which a pump chamber is formed;

a storage member in which the tubephragm is assembled and which forms a liquid accommodating chamber between the tubephragm and the storage member; and a liquid medium with which the liquid accommodating chamber is filled, and the first pump is a tubephragm pump that expands and contracts the tubephragm by the liquid medium to perform a pump operation.

7. The liquid supplying device according to claim 5, wherein the first pump comprises:

a bellows elongated and contracted axially;

a storage member in which the bellows is assembled and which forms a liquid accommodating chamber between the bellows and the storage member; and a liquid medium with which the liquid accommodating chamber is filled, and the first pump is a bellows pump that axially contracts the bellows for drive to perform a pump operation.

8. The liquid supplying device according to claim 1, wherein the second pump has at least two pump chambers, and in the circulating mode, when one of the pump chambers contracts, the other of the pump chambers expands.

* * * * *